United States Patent
Sohn et al.

(10) Patent No.: US 7,307,441 B2
(45) Date of Patent: Dec. 11, 2007

(54) INTEGRATED CIRCUIT CHIPS AND WAFERS INCLUDING ON-CHIP TEST ELEMENT GROUP CIRCUITS, AND METHODS OF FABRICATING AND TESTING SAME

(75) Inventors: Kwon-il Sohn, Yongin-shi (KR); Uk-Rae Cho, Kyunggi-do (KR); Su-Chul Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 639 days.

(21) Appl. No.: 10/365,143

(22) Filed: Feb. 12, 2003

(65) Prior Publication Data

US 2003/0213953 A1 Nov. 20, 2003

(30) Foreign Application Priority Data

May 15, 2002 (KR) ............ 10-2002-0026906

(51) Int. Cl.
G01R 31/26 (2006.01)
H01L 23/58 (2006.01)
H01L 21/66 (2006.01)

(52) U.S. Cl. ............ 324/765; 438/18; 257/48; 257/E25; 324/754

(58) Field of Classification Search ............ 257/48, 257/45, 46, 47; 438/16, 19, 2, 18; 324/754, 324/765

See application file for complete search history.

(56) References Cited

U.S. PATENT DOCUMENTS

| 4,243,937 A | | 1/1981 | Multani et al. |
| 4,799,009 A | | 1/1989 | Tada et al. |
| 5,477,062 A | * | 12/1995 | Natsume .................. 257/48 |
| 5,554,940 A | * | 9/1996 | Hubacher .................. 324/765 |
| 5,617,531 A | * | 4/1997 | Crouch et al. ............ 714/30 |
| 5,650,961 A | | 7/1997 | Himeno et al. |

(Continued)

FOREIGN PATENT DOCUMENTS

DE   10132371 A1   1/2003

(Continued)

OTHER PUBLICATIONS

Office Action for German Patent Application 103 23 668.6-33, mailed on Jan. 20, 2006.

(Continued)

*Primary Examiner*—Evan Pert
(74) *Attorney, Agent, or Firm*—Myers Bigel Sibley & Sajovec

(57) ABSTRACT

Integrated circuit chips include an internal circuit including interconnected semiconductor devices that are configured to provide integrated circuit functionality, and a Test Element Group (TEG) circuit that is configured to allow measuring of electrical characteristics of the semiconductor devices. By providing a TEG circuit in the same integrated circuit chip as the internal circuit, the TEG circuit may accurately represent the electrical characteristics of the interconnected semiconductor devices of the internal circuit of the associated integrated circuit chip. The integrated circuit chip may be coupled to a test apparatus. The test apparatus includes a test probe that is configured to simultaneously contact the internal circuit and the TEG circuit. The test apparatus also can simultaneously test the integrated circuit functionality of the internal circuit, and measure the electrical characteristics of the semiconductor devices via the TEG circuit.

48 Claims, 10 Drawing Sheets

U.S. PATENT DOCUMENTS

| | | | | |
|---|---|---|---|---|
| 5,703,381 | A | * | 12/1997 | Iwasa et al. .................. 257/48 |
| 5,768,195 | A | * | 6/1998 | Nakamura et al. ...... 365/189.09 |
| 5,811,983 | A | | 9/1998 | Lundberg |
| 5,923,048 | A | * | 7/1999 | Inoue .......................... 257/48 |
| 5,929,650 | A | * | 7/1999 | Pappert et al. .............. 324/763 |
| 5,936,420 | A | | 8/1999 | Sotokubo |
| 5,949,090 | A | | 9/1999 | Iwasa et al. |
| 5,956,567 | A | * | 9/1999 | Tomita ........................ 438/18 |
| 6,075,373 | A | | 6/2000 | Iino |
| 6,326,309 | B2 | | 12/2001 | Hatanaka et al. |
| 6,326,676 | B1 | | 12/2001 | Ohde et al. |
| 6,346,820 | B1 | | 2/2002 | Yamagami |
| 6,362,013 | B1 | * | 3/2002 | Yoshimura .................. 438/14 |
| 6,368,943 | B1 | | 4/2002 | Ohde et al. |
| 6,372,554 | B1 | | 4/2002 | Kawakita et al. |
| 6,556,938 | B1 | * | 4/2003 | Rohrbaugh et al. ......... 702/117 |
| 6,967,348 | B2 | * | 11/2005 | Cowles et al. ................ 257/48 |
| 7,124,341 | B2 | * | 10/2006 | Antley et al. ................ 714/734 |
| 2002/0013667 | A1 | * | 1/2002 | Zemer et al. .................. 702/57 |
| 2002/0047724 | A1 | | 4/2002 | Marshall et al. |
| 2002/0063251 | A1 | * | 5/2002 | Sugiura et al. ............... 257/48 |

FOREIGN PATENT DOCUMENTS

| | | | |
|---|---|---|---|
| JP | 58182237 A | | 10/1983 |
| JP | 05243356 A | | 9/1993 |
| JP | 08146095 A | | 6/1996 |
| JP | 09-172049 A | | 6/1997 |
| JP | 09-213901 A | | 8/1997 |
| JP | 11016963 A | | 1/1999 |
| JP | 2000-031221 A | | 1/2000 |
| JP | 2000021945 A | | 1/2000 |
| JP | 2000124283 A | | 4/2000 |
| JP | 2000-332077 A | | 11/2000 |
| JP | 9-213901 | * | 8/2001 |
| KR | 10-0206874 B1 | | 4/1999 |
| KR | 2000-0051684 A | | 8/2000 |

OTHER PUBLICATIONS

First Office Action from the Chinese Patent Office for Chinese Patent Application No. 03131477.5; May 28, 2006.

English translation of the First Office Action from the Chinese Patent Office for Chinese Patent Application No. 03131477.5; May 28, 2006.

* cited by examiner

- Fabricate Array of Chips, Including Internal Circuits, TEG Circuits, Pads and TEG Pads, in a Wafer — S100
- Simultaneously Probe/Test the Internal Circuits and the Test Element Group Circuit — S120
- Individually Packaging the Chips of the Semiconductor Wafer — S140

INTEGRATED CIRCUIT CHIPS AND WAFERS INCLUDING ON-CHIP TEST ELEMENT GROUP CIRCUITS, AND METHODS OF FABRICATING AND TESTING SAME

RELATED APPLICATION

This application claims the benefit of Korean Patent Application No. 2002-0026906, filed May 15, 2002, the disclosure of which is hereby incorporated herein by reference in its entirety as if set forth fully herein.

FIELD OF THE INVENTION

This invention relates to integrated circuit chips and wafers and fabrication and testing methods therefor, and more particularly to test structures for integrated circuit chips and wafers and methods of fabricating and testing the same.

BACKGROUND OF THE INVENTION

Integrated circuit chips are widely used in consumer, commercial and industrial applications. As is well known to those having skill in the art, integrated circuit chips generally are fabricated in integrated circuit wafers, which may comprise semiconductor materials. The wafers contain an array of scribe line regions that are arranged to provide a plurality of integrated circuit chips in the wafer. After fabrication, the integrated circuit wafer is diced along the scribe lines, to separate (singulate) the individual integrated circuit chips, which are then packaged for use.

As is well known to those having skill in the art, integrated circuit chips generally include internal circuits that include interconnected semiconductor devices such as transistors, diodes, capacitors, optical elements, optoelectronic elements, microelectromechanical (MEM) elements and/or other devices, which are configured to provide integrated circuit functionality, such as a memory device, a microprocessor, an electro optical device, an electromechanical device and/or other analog and/or digital integrated circuit functionality. The internal circuit may also include test circuits for testing the integrated circuit functionality, for example to test for proper operation of the memory device, microprocessor other integrated circuit functionality.

It is also known to provide a Test Element Group (TEG) in the integrated circuit wafer, to allow measuring of electrical characteristics of the semiconductor devices themselves. A TEG circuit may be used to measure electrical characteristics of the semiconductor devices, so that data that is obtained by measuring the TEG circuit during a TEG test may be used, for example, to solve process problems. For example, process problems may be discovered and solved by judging whether each process is carried out correctly using the measured electrical characteristics. In particular, the electrical characteristics of the semiconductor devices generally are not measured directly by measuring the interconnected semiconductor devices in the internal circuit. Rather, a TEG circuit is provided in the scribe area of the semiconductor wafer and/or as one or more discrete TEG chips at various locations in the semiconductor wafer. Since the TEG circuit is formed by the same process that is used to form the interconnected semiconductor devices in the internal circuit, the measure of electrical characteristics of the semiconductor devices in the TEG circuit can provide a measure of the electrical characteristics of the interconnected semiconductor devices in the internal circuit. Thus, electrical characteristics of the semiconductor devices in the chip can be obtained by testing the TEG circuits, i.e. by performing a TEG test.

TEG circuits have been used to test various electrical characteristics of semiconductor devices in an integrated circuit chip, such as the drain current of a transistor, the threshold voltage of an inverter, inter-metal open/short states, contact resistance, capacitance, and/or many other electrical characteristics. As was described above, data obtained through the TEG test may be utilized to estimate process reliability and/or stability. The TEG circuit can be formed in the scribe line regions of the wafer and/or in one or more separate TEG chips in the wafer. Various TEG circuits for measuring electrical characteristics of semiconductor devices in an integrated circuit chip are disclosed in Japanese Laid-Open Patent Application Nos. 2000-332077; 2000-31221; and Ser. No. 09-172049, and in Korean Patent Application Nos. 1997-53226 and 2000-51684. Other TEG circuits are described in U.S. Pat. Nos. 6,372,554; 6,368,943; 6,326,676; 6,326,309; 6,075,373; 5,936,420; and 5,650,961.

FIG. 11 is a flowchart illustrating conventional methods of fabricating and testing integrated circuit chips. As shown at Block S10, a plurality of integrated circuit chips, each including various internal circuits including interconnected semiconductor devices that are configured to provide integrated circuit functionality, are formed in a semiconductor wafer using well-known fabrication processes. Simultaneous with the fabrication of the internal circuits, a TEG circuit also is fabricated in the scribe line regions of the wafer and/or as one or more separate TEG chips in the wafer. Then, at Block S20, the TEG circuits are tested in order to measure electrical characteristics of the semiconductor devices in the internal circuits. An Electric Die Sorting (EDS) test is then performed on the internal circuits of the individual integrated circuit chips in the wafer, in order to determine which chips are properly performing their integrated circuit functionality. The EDS test generally is carried out using a tester that includes a probe card. The probe card includes probes such as needles and/or pins that electrically connect the tester to the chip or chips under test. The probes may be mounted on the probe card. Finally, referring to Block S40, after the EDS test, the good integrated circuit chips are assembled and packaged.

Unfortunately, conventional testing methods as illustrated in FIG. 11 may take an excessive time to perform the TEG test of Block S20 and the EDS tests of Block S30. Moreover, the TEG tests may produce inaccurate results, because the TEG circuits that are formed at the scribe line regions of the wafer and/or in separate TEG chips, may not be representative of the electrical characteristics of all of the integrated circuit chips in a wafer.

SUMMARY OF THE INVENTION

Integrated circuit chips according to some embodiments of the present invention comprise an internal circuit including interconnected semiconductor devices that are configured to provide integrated circuit functionality, and a Test Element Group (TEG) circuit that is configured to allow measuring of electrical characteristics of the semiconductor devices. According to some embodiments, by providing a TEG circuit in the same integrated circuit chip as the internal circuit, the TEG circuit may accurately represent the electrical characteristics of the interconnected semiconductor devices of the internal circuit of the associated integrated circuit chip.

In other embodiments, these integrated circuit chips also include a plurality of pads that are connected to the internal circuit, and at least one TEG pad that is connected to the TEG circuit. In still other embodiments, when the integrated circuit is packaged and connected to a lead frame, the lead frame is electrically connected to the plurality of pads, but is not electrically connected to the TEG pad.

In yet other embodiments, the integrated circuit chip is coupled to a test apparatus. The test apparatus includes a test probe that is configured to simultaneously contact the plurality of pads and the TEG pad. In other embodiments, the test apparatus also is configured to simultaneously test the integrated circuit functionality via the plurality of pads, and to measure the electrical characteristics of the semiconductor devices via the TEG pad. In some embodiments, the plurality of pads and the TEG pad are the same size. In other embodiments, the plurality of pads and the TEG pad are arranged in the same region of the integrated circuit chip, such as the periphery and/or the center of the integrated circuit chip.

Many different kinds of TEG circuits may be provided in an integrated circuit chip according to some embodiments of the present invention. In some embodiments, the integrated circuit includes a power supply line that is configured to be connected to an external power supply and a ground line that is configured to be connected to an external ground. In these embodiments, the TEG circuit is electrically connected to the power supply line and/or the ground pad internal to the integrated circuit chip. In other embodiments, the TEG circuit comprises first and second complementary field effect transistors and first and second fuses that are serially connected between the power supply line and the ground line, wherein the TEG pad is electrically connected to the first and second complementary field effect transistors. In still other embodiments, first, second, third and fourth fuses are provided.

In yet other embodiments, the integrated circuit includes a ground line that is configured to be connected to an external ground, and the TEG circuit includes a plurality of metal lines and a plurality of metal contact holes that are electrically connected between the ground line and the TEG pad. Over a thousand metal contact holes may be provided in some embodiments. At least some of the metal lines are provided on different levels of the integrated circuit chip in some embodiments. At least two metal contact holes electrically connect at least two of the metal lines in some embodiments. Fuses may be provided between the metal lines and the ground line, and between the metal lines and the TEG pad in still other embodiments.

Integrated circuit wafers according to some embodiments of the present invention include an array of scribe line regions in the wafer that are arranged to define a plurality of integrated circuit chips in the wafer. A respective integrated circuit chip comprises an internal circuit that includes interconnected semiconductor devices that are configured to provide integrated circuit functionality, and a TEG circuit that is configured to allow measuring of electrical characteristics of the semiconductor devices.

Integrated circuit chips may be tested, according to some embodiments of the present invention, by simultaneously probing an internal circuit of the integrated circuit chip that includes interconnected semiconductor devices that are configured to provide integrated circuit functionality, and a TEG circuit that is configured to allow measuring of electrical characteristics of the semiconductor devices. In other embodiments, the simultaneously probing is performed while the integrated circuit chip is part of a wafer of integrated circuit chips. Thus, in some embodiments, an integrated circuit wafer that includes a plurality of integrated circuit chips therein may be tested by simultaneously probing internal circuits of at least two of the integrated circuits, and TEG circuits of the at least two of the integrated circuits, a respective one of which is associated with a respective one of the integrated circuits, so as to allow measuring of electrical characteristics of the semiconductor devices in the integrated circuit that is associated therewith. Accordingly, these embodiments can allow the TEG testing data to be representative of the associated internal circuit, to allow better representation of the characteristics of the associated integrated circuit chip. Moreover, in other embodiments, TEG testing and EDS testing of at least one integrated circuit chip in an integrated circuit wafer may be performed simultaneously.

Finally, integrated circuit chip testers according to some embodiments of the present invention include a probe that is configured to contact a plurality of pads that are connected to an internal circuit of an integrated circuit, and to simultaneously contact a TEG pad that is connected to a TEG circuit. TEG testing and EDS testing, may be performed simultaneously.

DETAILED DESCRIPTION OF PREFERRED EMBODIMENTS

Figure 1:
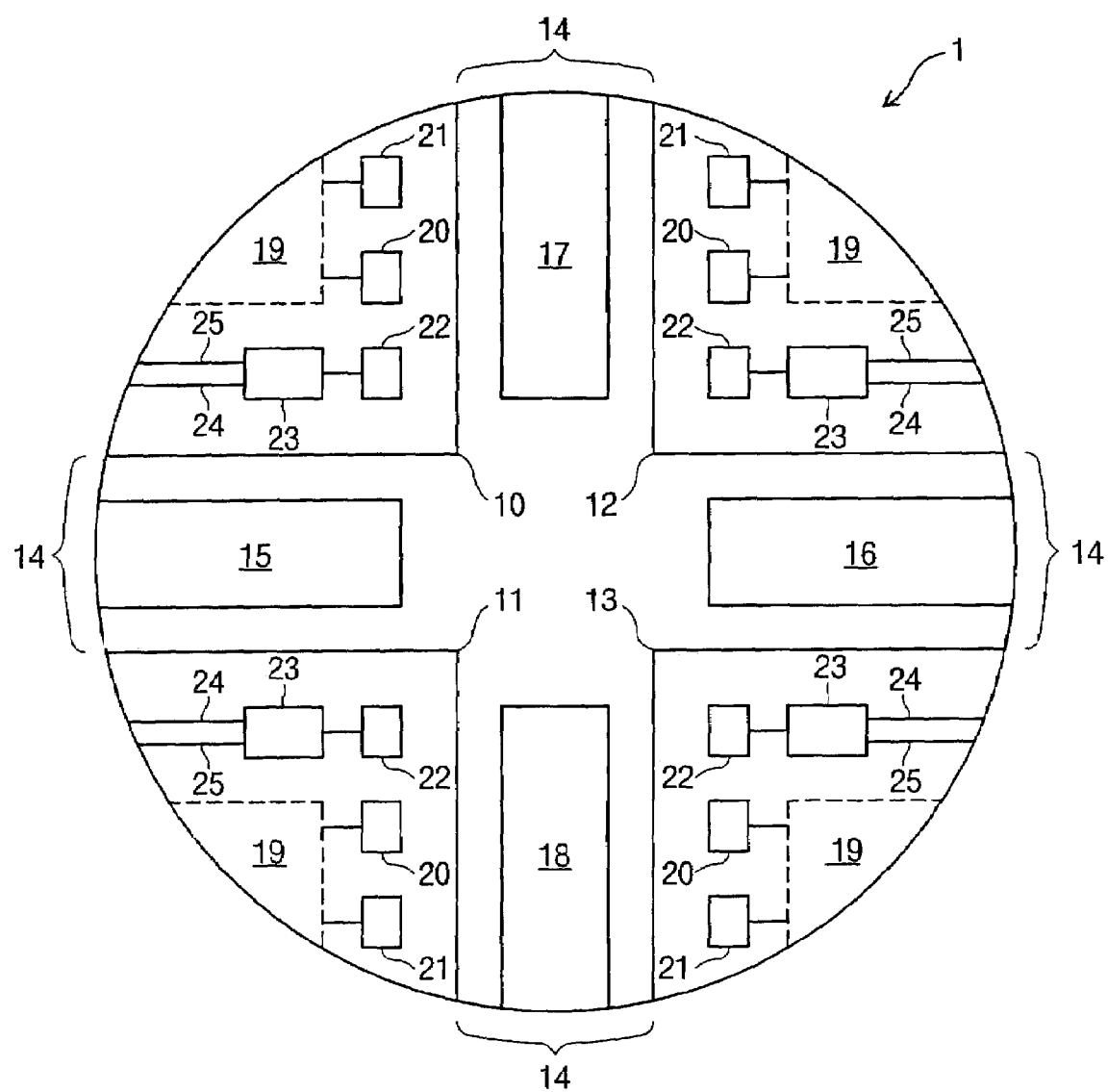
FIG. 1 is a top view of a wafer including integrated circuit chips according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Some embodiments of the present invention allow EDS and TEG tests of an integrated circuit chip to be carried out simultaneously in a predetermined test time. Accordingly, testing time may be reduced. Moreover, some embodiments of the present invention allow a TEG test to be performed for each integrated circuit chip using a TEG circuit that is in the associated integrated circuit chip. Electrical characteristics of the semiconductor devices thereby can be obtained at all regions of a wafer and in each integrated circuit chip, without requiring an increase in test time.

FIG. 1 is a top view of an integrated circuit wafer according to some embodiments of the present invention. Referring now to FIG. 1, an integrated circuit wafer 1 includes an array of scribe line regions 14 in the wafer that are arranged to define a plurality of integrated circuit chips 10, 11, 12 and 13 in the wafer 1. It will be understood by those having skill in the art that conventional wafers often include many more scribe line regions 14 and integrated circuit chips 10-13. Moreover, the scribe lines 14 need not be orthogonal and the integrated circuit chips 10-13 need not be square. In FIG. 1, a plurality of TEG circuits 15, 16, 17, 18 are included in the scribe line regions 14. These TEG circuits may be conventional TEG circuits that are employed in the scribe line regions 14, as was described in at least some of the above-cited patents and published patent applications.

Still referring to FIG. 1, a respective integrated circuit chip 10, 11, 12 or 13 comprises an internal circuit 19 including interconnected semiconductor devices that are configured to provide integrated circuit functionality. Moreover, each integrated circuit chip 10, 11, 12, 13 also includes a TEG circuit 23 that is configured to allow measuring of electrical characteristics of the semiconductor devices. It will be understood that, in FIG. 1, identical integrated circuit chips 10, 11, 12, 13 are illustrated. However, in other embodiments, at least some of the integrated circuit chips need not be identical.

Still referring to FIG. 1, the integrated circuit chips 10, 11, 12 or 13 also include a plurality of pads 20 and 21, also referred to herein as "bonding pads", that are connected to the internal circuit 19. These bonding pads may provide input/output and/or power connections for the internal circuit 19, to provide the integrated circuit functionality.

Still referring to FIG. 1, each integrated circuit chip also includes a TEG pad 22, also referred to as a test pad, that is connected to the TEG circuit 23. It will be understood that more than two pads 20 and 21 may be provided for each integrated circuit chip, and more than one TEG pad 22 also may provided for each integrated circuit chip. Moreover, a TEG circuit 23 and a TEG pad 22 need not be provided for every integrated circuit chip in a wafer.

Finally, it will be understood that the physical arrangement of the pads 20 and 21, and the TEG pad 22 need not be as shown in FIG. 1. For example, the bonding pads and the TEG pad may be disposed in a center region of the integrated circuit chip, as shown in FIG. 2A, and/or along an edge of the chip, as shown in FIG. 2B.

Figure 2A:
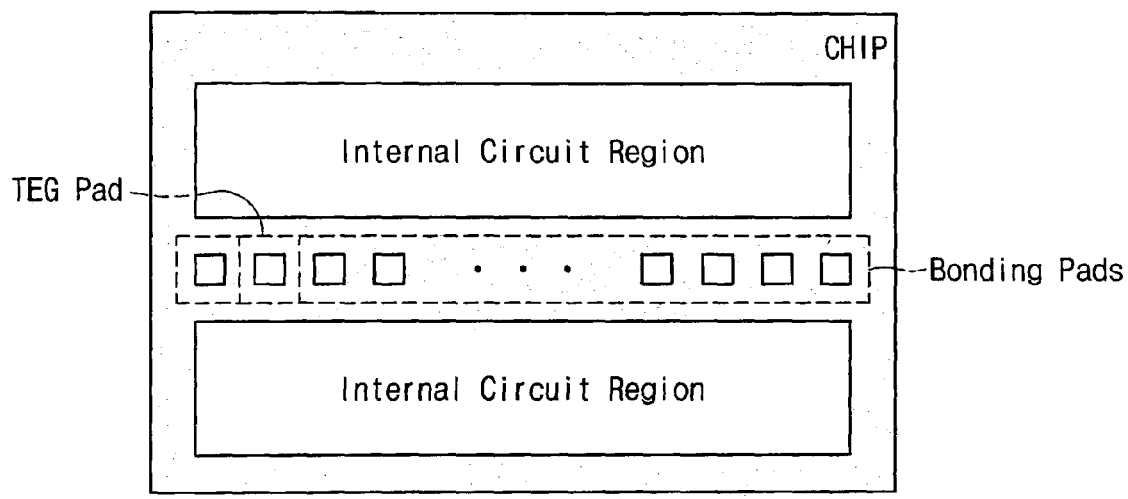
FIGS. 2A and 2B are top views of integrated circuit chips including different locations of pads, according to some embodiments of the present invention.
Figure 2B:
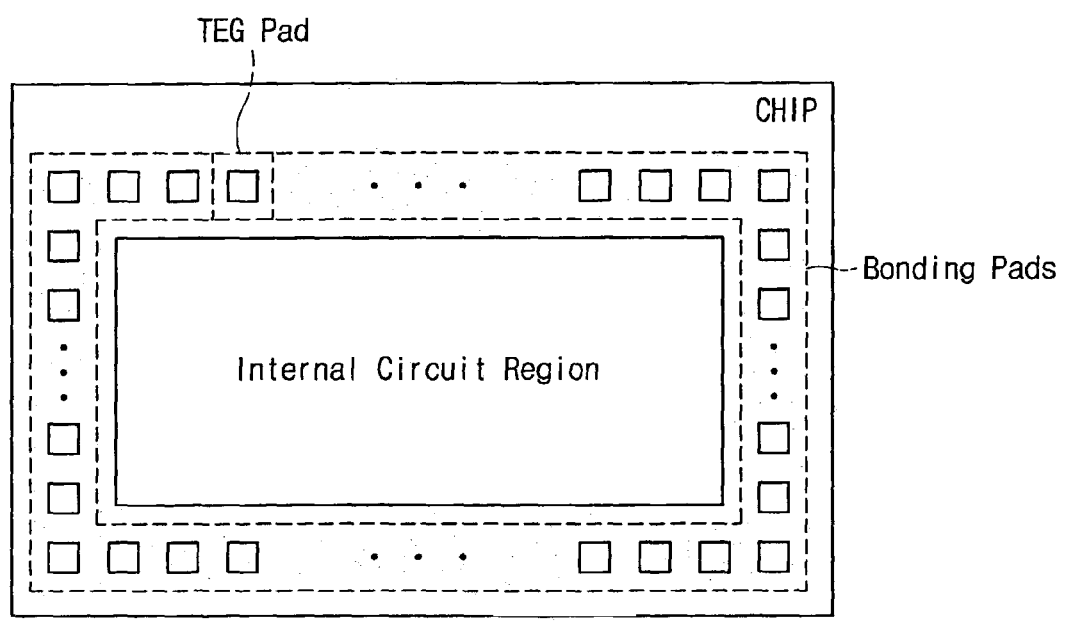

As also shown in FIG. 1 and FIGS. 2A-2B, the plurality of pads 20-21 and the TEG pad 22 may be of the same size and arranged in the same region of the integrated circuit chip 10-13. In other embodiments, they need not be of the same size, and may be placed in separate regions of the integrated circuit chip. In some embodiments, this size is sufficient for a probe, such as a probe pin and/or needle, to contact the pads or the TEG pads.

Still referring to FIG. 1, in some embodiments, the integrated circuit chip also includes a power supply line 24 that is configured to be connected to an external power supply, for example via a power supply pad, and a ground line 25 that is configured to be connected to an external ground, for example via an external ground pad. As also shown in FIG. 1, in some embodiments, the TEG circuit 22 is electrically connected to the power supply line 24 and/or the ground line 25 internal to the integrated circuit chip. In some embodiments of the present invention, the TEG circuit 23 may be used to measure electrical characteristics of the integrated circuit chips 10, 11, 12 or 13, such as the drain current of a transistor, the threshold voltage of an inverter, inter-metal open/short states, contact resistance, capacitance and/or other electrical characteristics of the semiconductor devices. The TEG circuit 23 can use a power supply voltage supplied via the power supply line 24 and/or the ground voltage supplied via the ground line 25, to provide its operating voltages.

Since an integrated circuit chip 10, 11, 12 or 13 includes an associated TEG circuit 23 and TEG pad 22, the electrical characteristics of the interconnected semiconductor devices that are included in the internal circuit 19 that is associated with the given integrated circuit chip may be measured, to allow an accurate characterization of the semiconductor devices of that integrated circuit chip. Thus, in some embodiments, it is possible to directly obtain the electrical characteristics of the integrated circuit chips in the wafer 1, on a per-chip basis. The fabrication process may then be controlled or measured by studying the electrical characteristics that are obtained from multiple integrated circuit chips in a wafer. An accurate process profile thereby can be maintained by measuring the electrical characteristics of some or all the integrated circuit chips in the wafer, in some embodiments.

Figure 3:
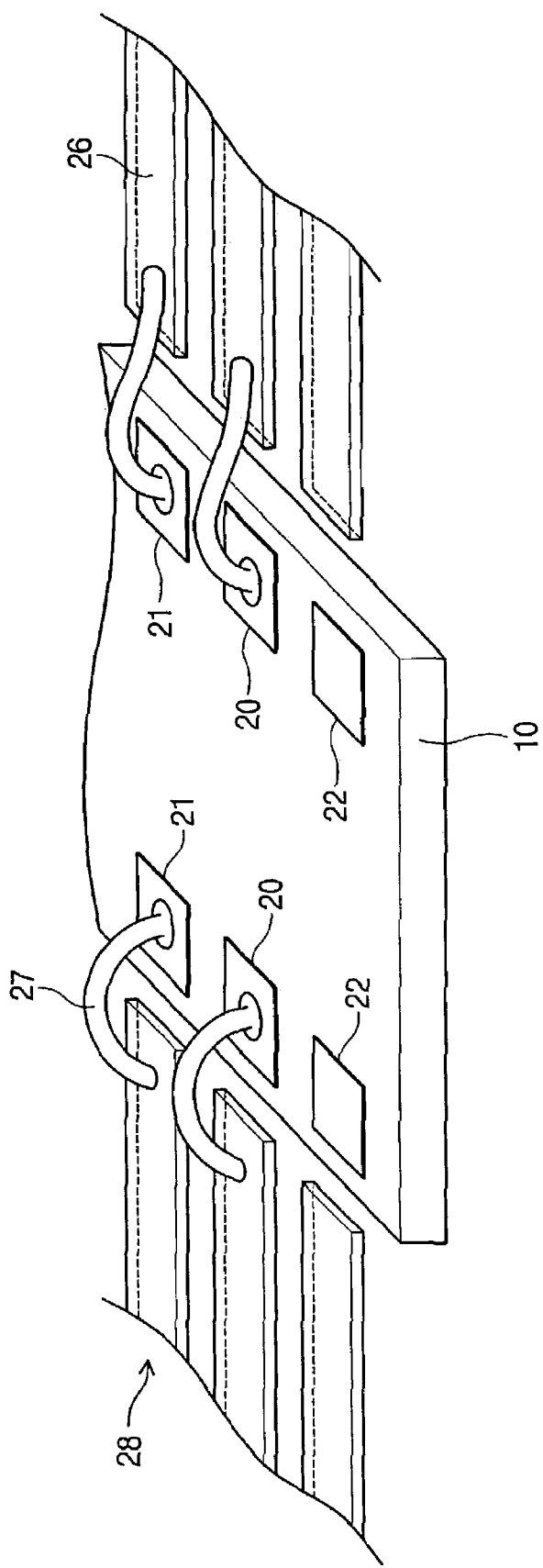
FIG. 3 illustrates connections between leads of a lead frame and pads of an integrated circuit chip according to some embodiments of the present invention.

After testing, the integrated circuit chips 10, 11, 12 and 13 are packaged for use. The bonding pads 20, 21 that are connected to the internal circuit 19 are connected to leads and/or package pins of a lead frame using bonding wires and/or other conventional techniques, to provide the integrated circuit functionality. The bonding pads may be used to receive a power supply voltage, a ground voltage, control signals, address signals and/or input/output data. In contrast, the TEG pad 22 generally is not connected to the lead frame, because it is not used after TEG testing, according to some embodiments of the present invention. Thus, as shown in FIG. 3, the bonding pads 20 and 21 are electrically connected to corresponding leads of a lead frame 28, through corresponding wires 27 during packaging. The test pad or pads 22, however, are not connected to the lead frame 28 using a bonding wire 27.

Figure 4:
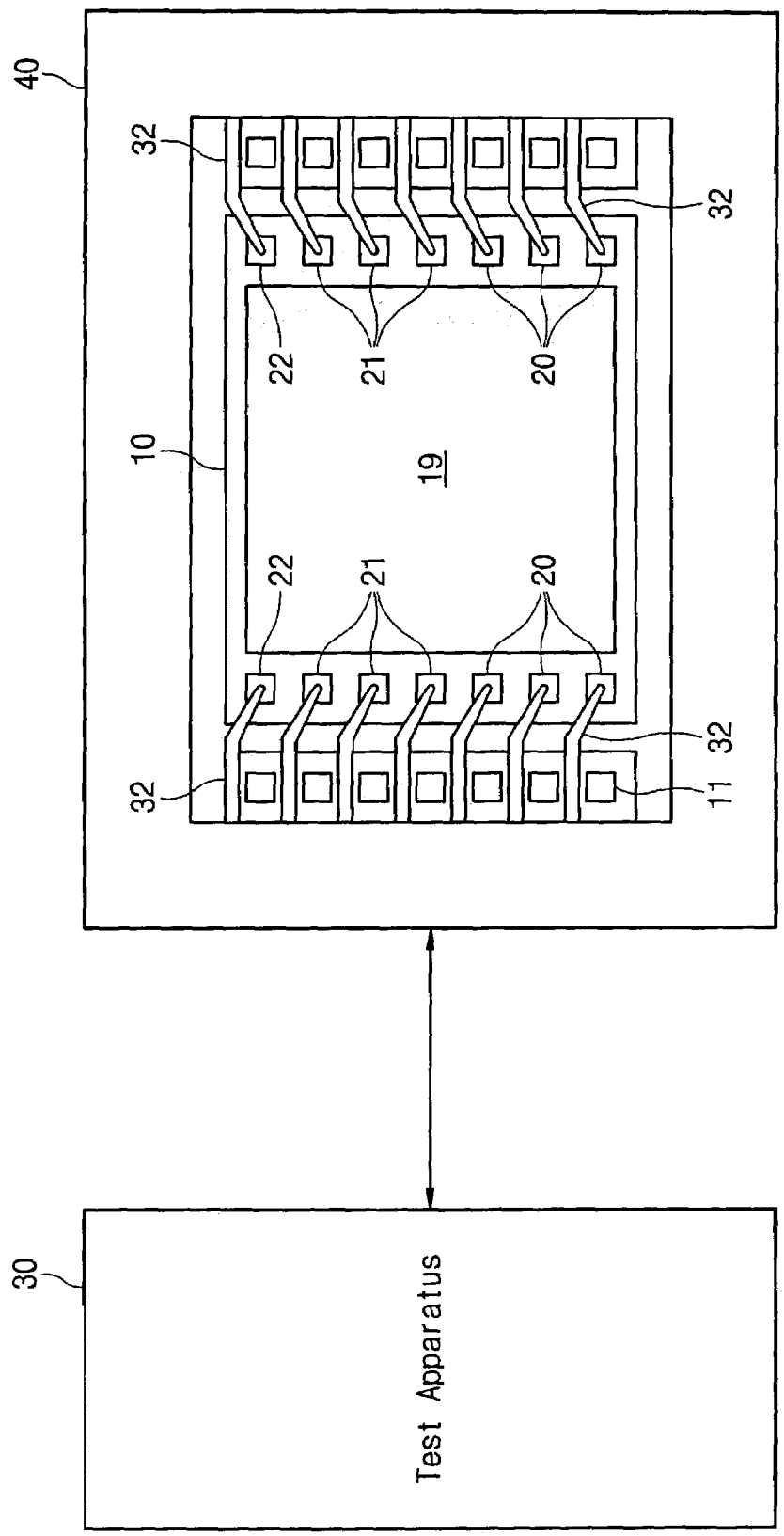
FIG. 4 illustrates connections between probes and pads of an integrated circuit chip during testing, according to some embodiments of the present invention.

FIG. 4 is a block diagram of integrated circuit chips according to some embodiments of the present invention during testing. As shown in FIG. 4, some embodiments of the present invention allow a test probe to simultaneously contact the plurality of bonding pads 20 and 21, and the TEG pad or pads 22. As shown in FIG. 4, the test probe comprises a probe card 40 including a plurality of probes 32, such as pins or needles, attached thereto. The probes 32 electrically contact the plurality of bonding pads 20 and 21, and the TEG pads 22 simultaneously. Signals from the probes 32 are transferred to the test apparatus 30 through the probe card 40, so that, in some embodiments, the test apparatus 30 is configured to simultaneously test the integrated circuit functionality (such as an EDS test) via the plurality of pads 21 and 20, and to measure the electrical characteristics of the semiconductor devices (TEG tests) via the TEG pad 22. Accordingly, in some embodiments, electrical properties can be obtained across various regions of the wafer and at some or each integrated circuit chip, without the need to increase test times. It is, therefore, possible to screen defective chips or wafers by measuring the electrical characteristics of some or all integrated circuit chips on a wafer during the EDS test time, without the need for additional test time. Accordingly, the package cost can be reduced.

In some embodiments, the testing that is performed in FIG. 4 may be performed after the wafer has been singulated into individual integrated circuit chips. However, in other embodiments as shown in FIG. 4, the individual chips may be tested while they are still in the wafer. Thus, FIG. 4 illustrates portions of an adjoining chip 11 to the left of the chip 10 in a wafer, and another adjoining chip to the right of the chip 10. Testing may be performed by moving the probe card 40 from chip to chip on the wafer and/or providing a probe card 40 and test apparatus 30 that can electrically contact and test more than one chip simultaneously.

Figure 5:
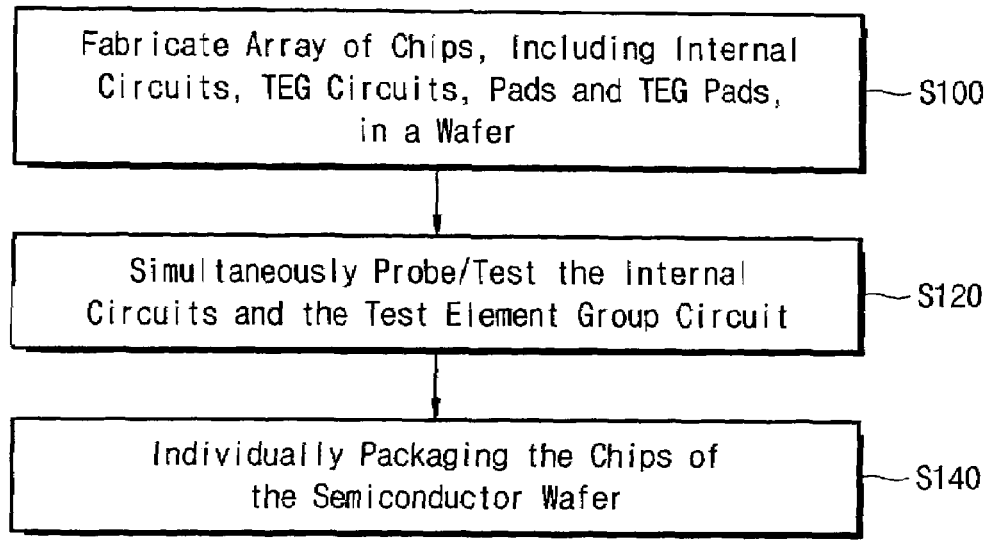
FIG. 5 is a flowchart of operations for fabricating and testing integrated circuit chips according to some embodiments of the present invention.

FIG. 5 is a flowchart of operations for testing an integrated circuit wafer that includes a plurality of integrated circuit chips therein, according to some embodiments of the present invention. In general, operations of FIG. 5 can provide simultaneous probing of internal circuits and TEG circuits. Moreover, some embodiments allow simultaneously performing TEG testing and EDS testing of at least one integrated circuit in the integrated circuit wafer.

In particular, referring to FIG. 5 at Block S100, an array of chips is fabricated in a wafer, a respective chip including internal circuits, TEG circuits, pads and TEG pads. For example, a TEG pad 22, a TEG circuit 23, a plurality of pads 20 and 21, and an internal circuit 19 of FIG. 1, may be fabricated in each integrated circuit chip 10-13 in a wafer 1 of FIG. 1. Then, referring to Block S120, the internal circuits and the TEG circuits are simultaneously probed, as shown in FIG. 4, and also may be simultaneously tested, as shown in FIG. 4. For example, after connecting probes 32 to the bonding pads 20 and 21, and to the TEG pads 22, EDS and TEG tests may be simultaneously performed with respect to the integrated circuit chip. Finally, at Block S140, the individual chips are packaged, for example by connecting a lead frame, as was shown in FIG. 3, wherein bond wires 27 connect the lead frame to the pads 20 and 21, but the TEG pad 22 is not wired.

Figure 6:
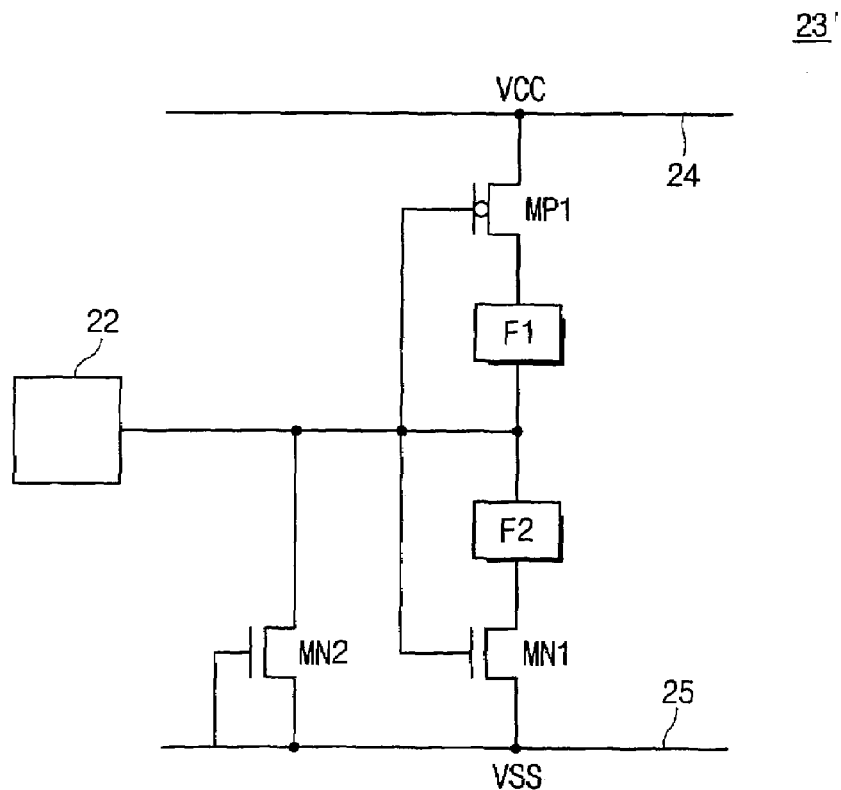
FIGS. 6-9 are circuit diagrams of TEG circuits according to some embodiments of the present invention.

Many different TEG circuits may be provided according to various embodiments of the present invention. In particular, FIG. 6 describes a TEG circuit 23' that comprises first and second complementary field effect transistors MP1, MN1, and first and second fuses F1 and F2 that are serially connected between a power supply line 24 and a ground line 25, wherein the TEG pad 22 is electrically connected to the first and second complementary field effect transistors MP1, MN1. In particular, referring to FIG. 6, this TEG circuit 23' includes a PMOS transistor MP1, two NMOS transistors MN1 and MN2, and two fuses F1 and F2. The fuses F1 and F2 may be laser fuses, electric fuses and/or other conventional fuses. The gate of PMOS transistor MP1 is connected to the test pad 22 and its source is connected to the power supply line 24. The fuse F1 has a first terminal that is connected to the drain of the PMOS transistor MP1, and a second terminal that is connected to the test pad 22. The source of NMOS transistor MN1 is connected to the ground line 25, and the drain is connected to the test pad 22 via the second fuse F2. The gate of NMOS transistor MN1 is connected to the test pad/22. A second NMOS transistor MN2 is connected between the test pad 22 and the ground line 25, to provide electrostatic discharge protection.

When performing an EDS test of an integrated circuit chip, as illustrated in FIG. 4, the probes 32 of the probe card 40 are simultaneously electrically connected to the bonding pads 20 and 21, and the test pad 22, respectively. The power supply voltage VCC and the ground voltage VSS are supplied to the integrated circuit during an EDS test using, for example, a power supply and ground pad of the integrated circuit. The TEG circuit 23' can be tested using only one test pad 22, shown in FIG. 6. When testing the TEG circuit 23' of FIG. 6, a voltage applied to the test pad 22 is repeatedly swung from 0V to VCC, and from VCC to 0V. During these voltage swings, the drain current of the PMOS and NMOS transistors MP1 and MN1 can be measured by checking the current flowing in or out of the test pad 22. When no current flows to the test pad 22, the voltage of the test pad 22 provides an indication of the threshold voltage of the inverter that is formed by the PMOS and NMOS transistors MP1 and MN1. Moreover, the drain current of the PMOS and NMOS transistors MP1 and MN1, respectively, can be measured by cutting the fuses F1 and F2 selectively.

Figure 7:
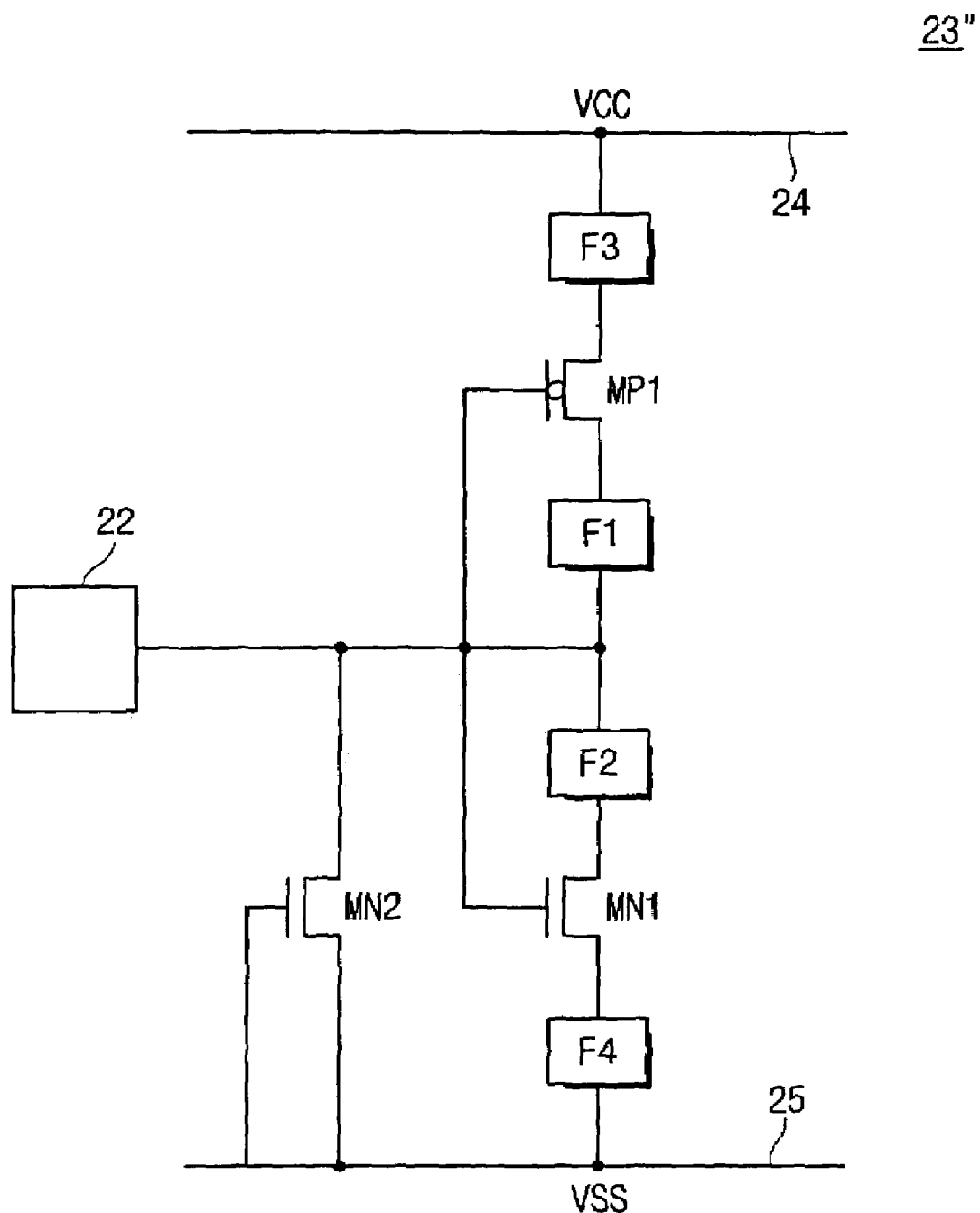

FIG. 7 illustrates a TEG circuit 23" according to other embodiments of the present invention. The TEG circuit 23" of FIG. 7 is similar to the TEG circuit 23' of FIG. 6, except that fuses F3 and F4 are added. The fuses F3 and F4 may be used to remove the TEG circuit 23" from interaction with the integrated circuit after the EDS and/or TEG tests are completed. In particular, after the TEG test is completed, the fuses F3 and F4 may be cut so that the TEG circuit 23" is electrically isolated from the power supply line 24 and the ground line 25. The fuses F3 and F4 may be laser fuses, electric fuses and/or any other conventional fuses.

Figure 8:
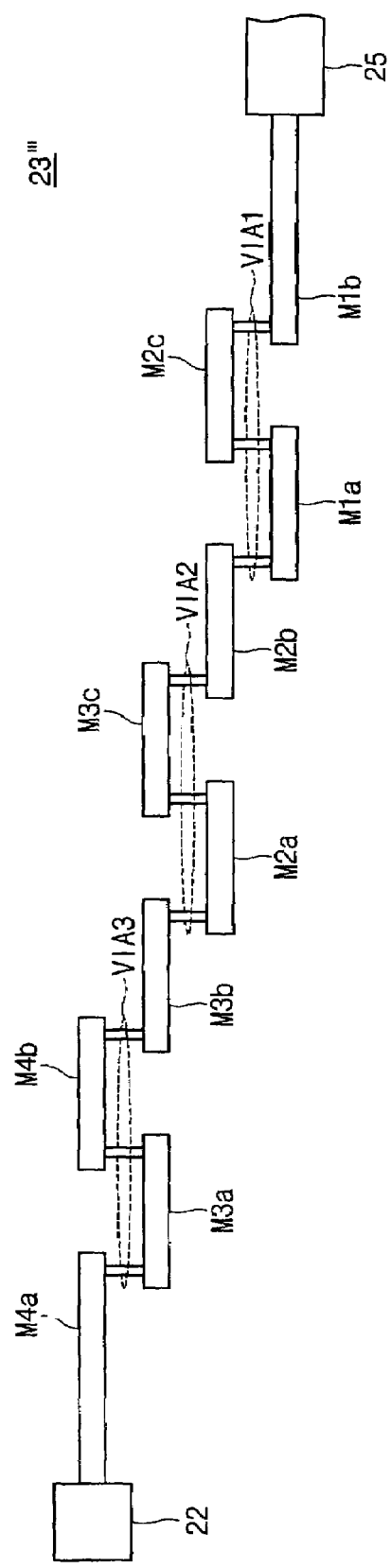

FIG. 8 illustrates TEG circuits 23''' according to other embodiments of the present invention. These TEG circuits 23''' include a ground line 25 that is configured to be connected to an external ground, a plurality of metal lines (indicated in FIG. 8 by the designator M), and a plurality of metal contact holes, also referred to as vias (indicated in FIG. 8 by the designator VIA), that are electrically connected between the ground line 25 and the TEG pad 22. More specifically, referring to FIG. 8, the TEG circuit 23''' comprises a plurality of metal lines M4a-M4b, M3a-M3c, M2a-M2c and M1a-M1b that are connected in series between the TEG pad 22 and the ground line 25 through corresponding metal contact holes VIA3-VIA1. In some embodiments, the metal lines are divided into multiple groups, which are formed in different layers of the integrated circuit chip. For clarity's sake in FIG. 8, only ten metal lines are connected in series through eight metal contact holes. However, more metal lines can be used, such that large numbers of metal contact holes, such as up to 500 or 1000 or more metal contact holes, are formed. In other embodiments, at least two metal contact holes electrically connect two of the metal lines.

Large numbers of metal contact holes may provide advantages. In particular, the TEG test of the TEG circuit 23''' may be carried out by measuring the amount of current that flows into the test pad 22 when a voltage is applied to the test pad 22. Since each metal contact hole has a very small resistance value, a large amount of current may flow into the test pad 22 during the TEG test. Accordingly, large numbers of parallel metal contact holes may be formed, to reduce the amount of current that flows into the test pad 22. It also will be understood that in embodiments of FIG. 8, since the ground line 25 is connected to the TEG circuit 23''', a power supply line 24 is not needed for these embodiments of TEG circuits 23'''.

Figure 9:
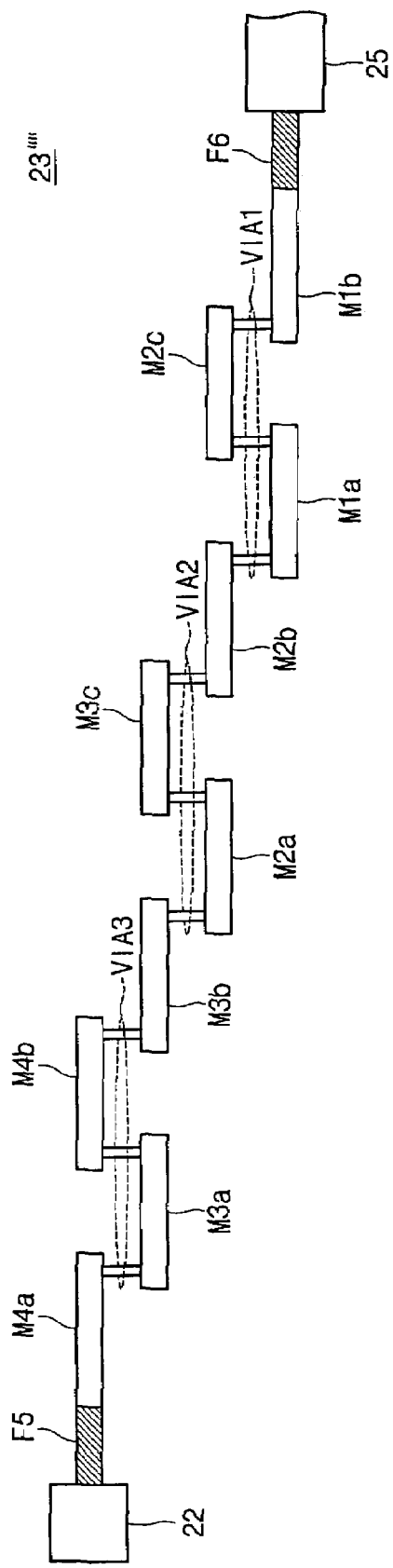

FIG. 9 illustrates TEG circuits according to other embodiments of the present invention. In particular, FIG. 9 illustrates TEG circuits 23'''', in which a first fuse F6 is added between the metal lines and the ground lines 25, and a second fuse F5 is added between the metal lines and the TEG pad 22. Accordingly, the TEG circuit 23'''' of FIG. 9 is similar to the TEG circuit 23''' of FIG. 8, except that fuses F5 and F6 are added. The fuses F5 and F6 may be used to electrically isolate the TEG circuit 23'''' from the ground line 25 after the EDS and/or TEG tests are performed. The fuses can be laser fuses, electric fuses and/or any other conventional fuses.

Figure 10:
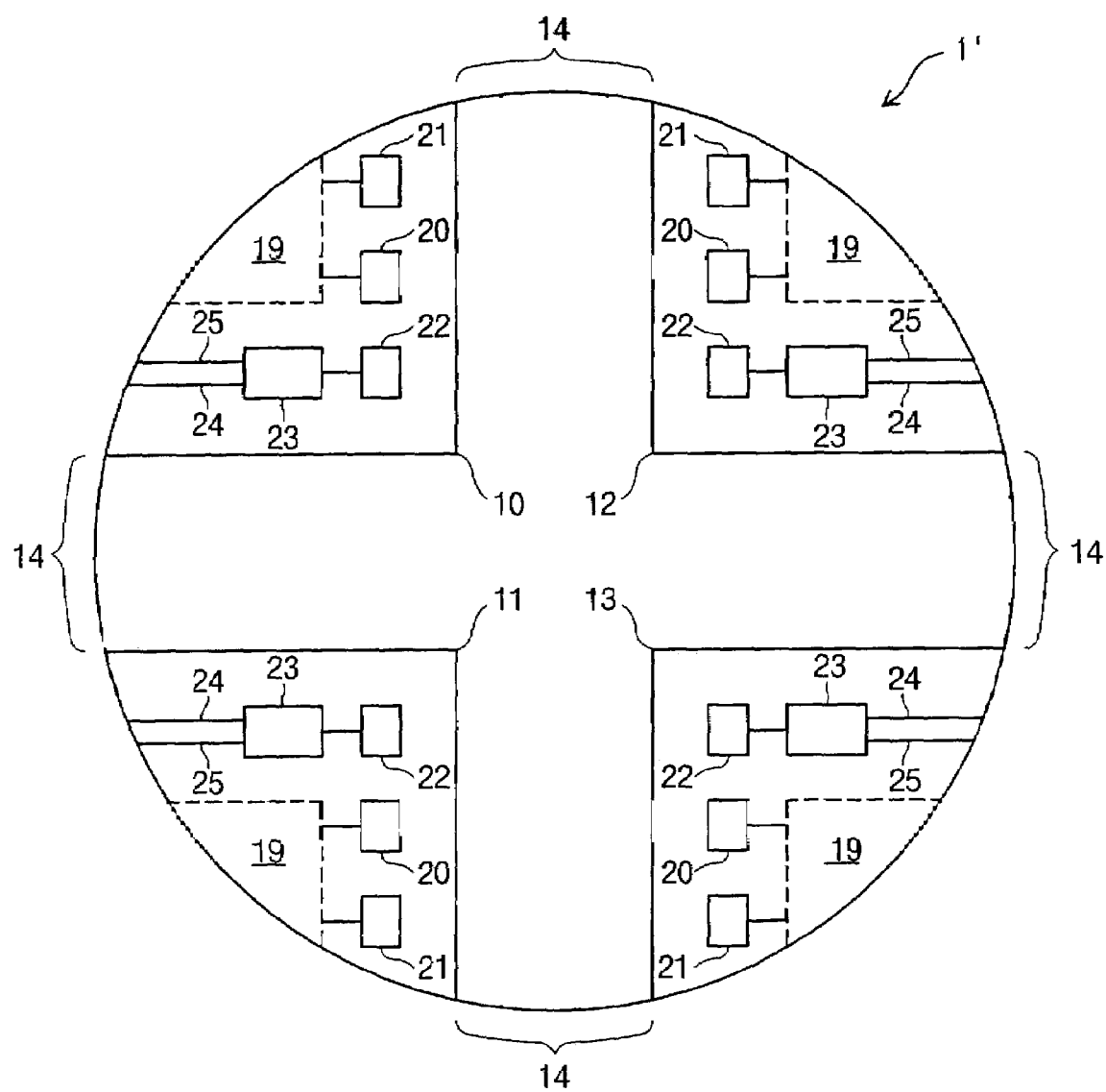
FIG. 10 is a top view of other integrated circuit wafers according to some embodiments of the present invention.
Figure 11:
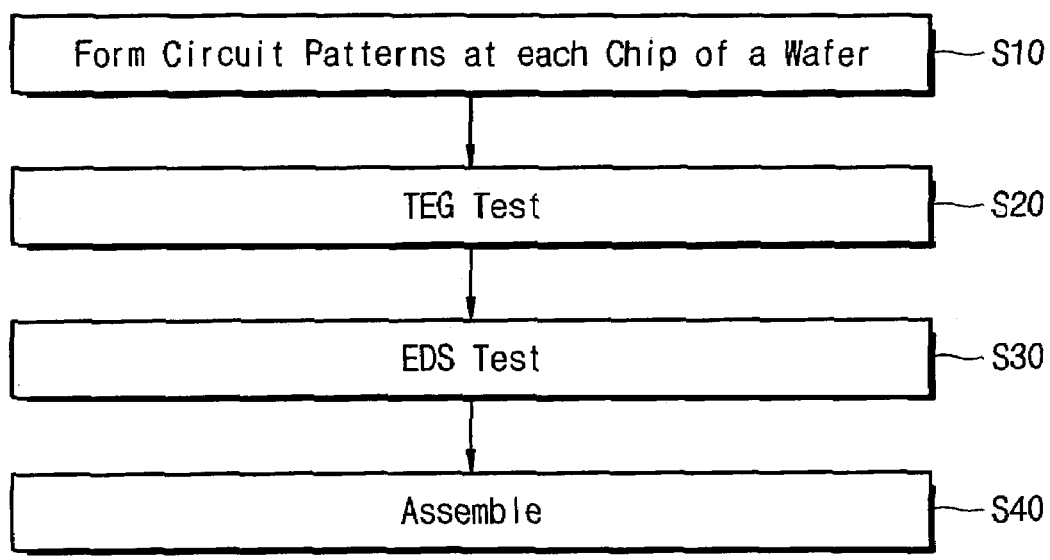
FIG. 11 is a flowchart of conventional methods of fabricating and testing integrated circuit chips.

In some embodiments of the invention, as illustrated, for example, in FIG. 1, EDS and TEG tests for integrated circuit chips may be performed simultaneously. In embodiments shown in FIG. 1, it may be desirable to perform additional TEG tests that are related to a TEG circuit 15 that is formed in the scribe line regions 14 of a wafer. In some embodiments, the TEG tests of the TEG circuits 15 in the scribe line regions 14 may be performed simultaneously with the EDS test and the TEG tests of the TEG circuits 23 in the integrated circuit chips 10-13. In other embodiments, as illustrated in FIG. 10, it may be possible to measure the desired electrical characteristics of the integrated circuit chips 10-13 using only the TEG circuit 23 that is contained in the integrated circuit chips 10-13. In these embodiments, as shown in FIG. 10, the wafers 1' need not include TEG circuits formed in the scribe line regions 14 of the wafer. This can further reduce test time.

Accordingly, some embodiments of the present invention can allow the electrical characteristics of semiconductor devices to be measured through one or more test pads that are included on an integrated circuit chip, by using as its operating voltage a power supply voltage and/or a ground voltage that are supplied through other pads of the integrated circuit chip. Moreover, embodiments of the present invention can allow a TEG test to be performed simultaneously with an EDS test, and can accurately measure electric characteristics of some or each of the integrated circuit chips in a wafer directly. Thus, some embodiments of the invention can allow the electrical characteristics of each chip to be tested without necessitating an increase in the test time. Moreover, package costs can be reduced in some embodiments by discriminating bad chips or wafers early in the manufacturing process using a large amount of data that is measured from each of the integrated circuit chips on a wafer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit chip comprising:
   an internal circuit including interconnected semiconductor devices that are configured to provide integrated circuit functionality;
   a plurality of pads that are connected to the internal circuit;
   a test element group circuit that includes additional semiconductor devices, the test element group circuit configured to allow measuring of electrical characteristics of the interconnected semiconductor devices by measuring electrical characteristics of the additional semiconductor devices included in the test element group;
   a test element group pad that is connected to the test element group circuit; and
   a lead frame that is electrically connected to the plurality of pads but is not electrically connected to the test element group pad.

2. An integrated circuit chip according to claim 1 in combination with a test probe that is configured to simultaneously contact the plurality of pads and the test element group pad.

3. An integrated circuit chip according to claim 1 wherein the plurality of pads and the test element group pad are of same size.

4. An integrated circuit chip according to claim 1 wherein the plurality of pads and the test element group pad are arranged in a same region of the integrated circuit chip.

5. The integrated circuit chip of claim 1, wherein at least one of the electrical characteristics comprises a current of a transistor, a threshold voltage, an inter-metal open/short state, a contact resistance and/or a capacitance.

6. An integrated circuit chip comprising:
   an internal circuit including interconnected semiconductor devices that are configured to provide integrated circuit functionality;
   a plurality of pads that are connected to the internal circuit;
   a test element group circuit that is configured to allow measuring of electrical characteristics of the semiconductor devices; and
   a test element group pad that is connected to the test element group circuit;
   the integrated circuit chip in combination with a test probe that is configured to simultaneously contact the plurality of pads and the test element group pad and with a test apparatus that is configured to simultaneously test the integrated circuit functionality via the plurality of pads and to measure the electrical characteristics of the semiconductor devices via the test element group pad.

7. An integrated circuit chip comprising:
   an internal circuit including interconnected semiconductor devices that are configured to provide integrated circuit functionality;
   a plurality of pads that are connected to the internal circuit;
   a test element group circuit that includes additional semiconductor devices, the test element group circuit configured to allow measuring of electrical characteristics of the interconnected semiconductor devices by measuring electrical characteristics of the additional semiconductor devices included in the test element group;
   a test element group pad that is connected to the test element group circuit;
   a power supply line that is configured to be connected to an external power supply; and
   a ground line that is configured to be connected to an external ground;
   wherein the test element group circuit is electrically connected to the power supply line and/or the ground line internal to the integrated circuit chip.

8. An integrated circuit chip according to claim 7 wherein the test element group circuit comprises first and second complementary field effect transistors and first and second fuses that are serially connected between the power supply line and the ground line, the test element group pad being electrically connected to the first and second complementary field effect transistors.

9. An integrated circuit chip according to claim 7 wherein the test element group circuit comprises first and second complementary field effect transistors and first, second, third and fourth fuses that are serially connected between the power supply line and the ground line, the test element group pad being electrically connected to the first and second complementary field effect transistors.

10. The integrated circuit chip of claim 7, wherein at least one of the electrical characteristics comprises a current of a transistor, a threshold voltage, an inter-metal open/short state, a contact resistance and/or a capacitance.

11. An integrated circuit chip comprising:
   an internal circuit including interconnected semiconductor devices that are configured to provide integrated circuit functionality;
   a plurality of pads that are connected to the internal circuit;
   a test element group circuit that includes additional semiconductor devices, the test element group circuit configured to allow measuring of electrical characteristics of the interconnected semiconductor devices by measuring electrical characteristics of the additional semiconductor devices included in the test element group;
   a test element group pad that is connected to the test element group circuit; and
   a ground line that is configured to be connected to an external ground, the test element group circuit comprising a plurality of metal lines and a plurality of metal contact holes that are electrically connected between the ground line and the test element group pad.

12. An integrated circuit chip according to claim 11 wherein the plurality of metal contact holes is at least 1000 metal contact holes.

13. An integrated circuit chip according to claim 11 wherein at least some of the metal lines are on different levels of the integrated circuit chip.

14. An integrated circuit chip according to claim 11 wherein at least two metal contact holes electrically connect two of the metal lines.

15. An integrated circuit chip according to claim 11 further comprising a first fuse between the metal lines and the ground line and a second fuse between the metal lines and the test element group pad.

16. The integrated circuit chip of claim 11, wherein at least one of the electrical characteristics comprises a current of a transistor, a threshold voltage, an inter-metal open/short state, a contact resistance and/or a capacitance.

17. An integrated circuit wafer comprising:
   an array of scribe line regions in the wafer that are arranged to define a plurality of integrated circuit chips in the wafer;
   a respective integrated circuit chip comprising an internal circuit including interconnected semiconductor devices that are configured to provide integrated circuit functionality and a test element group circuit that includes additional semiconductor devices, the test element group circuit configured to allow measuring of electrical characteristics of the interconnected semiconductor devices by measuring electrical characteristics of the additional semiconductor devices included in the test element group;
   a plurality of pads that are connected to the internal circuit;
   a test element group pad that is connected to the test element group circuit; and
   a lead frame that is electrically connected to the plurality of pads but is not electrically connected to the test element group pad.

18. An integrated circuit wafer according to claim 17 in combination with a test probe that is configured to simultaneously contact the plurality of pads and the test element group pad of at least one of the integrated circuit chips.

19. An integrated circuit wafer according to claim 18 in further combination with a test apparatus that is configured to simultaneously test the integrated circuit functionality of at least one of the integrated circuit chips via the plurality of pads and to measure the electrical characteristics of the semiconductor devices in the at least one of the integrated circuit chips via the test element group pad.

20. An integrated circuit wafer according to claim 17 wherein the plurality of pads and the test element group pad are of same size.

21. An integrated circuit wafer according to claim 17 wherein the plurality of pads and the test element group pad are arranged in a same region of a respective integrated circuit chip.

22. The integrated circuit wafer of claim 17, wherein at least one of the electrical characteristics comprises a current of a transistor, a threshold voltage, an inter-metal open/short state, a contact resistance and/or a capacitance.

23. An integrated circuit wafer comprising:
   an array of scribe line regions in the wafer that are arranged to define a plurality of integrated circuit chips in the wafer;
   a respective integrated circuit chip comprising an internal circuit including interconnected semiconductor devices that are configured to provide integrated circuit functionality and a test element group circuit that includes additional semiconductor devices, the test element group circuit configured to allow measuring of electrical characteristics of the interconnected semiconductor devices by measuring electrical characteristics of the additional semiconductor devices included in the test element group;
   a power supply line that is configured to be connected to an external power supply; and
   a ground line that is configured to be connected to an external ground;
   wherein the test element group circuit is electrically connected to the power supply line and/or the ground line internal to the integrated circuit chip.

24. An integrated circuit wafer according to claim 23 wherein the test element group circuit comprises first and second complementary field effect transistors and first and second fuses that are serially connected between the power supply line and the ground line.

25. An integrated circuit wafer according to claim 23 wherein the test element group circuit comprises first and second complementary field effect transistors and first, second, third and fourth fuses that are serially connected between the power supply line and the ground line.

26. The integrated circuit wafer of claim 23 wherein at least one of the electrical characteristics comprises a current of a transistor, a threshold voltage, an inter-metal open/shod state, a contact resistance and/or a capacitance.

27. An integrated circuit wafer comprising:
   an array of scribe line regions in the wafer that are arranged to define a plurality of integrated circuit chips in the wafer;

a respective integrated circuit chip comprising an internal circuit including interconnected semiconductor devices that are configured to provide integrated circuit functionality and a test element group circuit that includes additional semiconductor devices, the test element group circuit configured to allow measuring of electrical characteristics of the interconnected semiconductor devices by measuring electrical characteristics of the additional semiconductor devices included in the test element group; and a ground line that is configured to be connected to an external ground, the test element group circuit comprising a plurality of metal lines and a plurality of metal contact holes, at least one of which is electrically connected to the ground line.

28. An integrated circuit wafer according to claim 27 wherein the plurality of metal contact holes is at least 1000 metal contact holes.

29. An integrated circuit wafer according to claim 27 wherein at least some of the metal lines are on different levels of the integrated circuit chip.

30. An integrated circuit wafer according to claim 27 wherein at least two metal contact holes electrically connect two of the metal lines.

31. An integrated circuit chip according to claim 27 further comprising a first fuse between the metal lines and the ground line and a second fuse that is electrically connected to at least one of the metal lines.

32. The integrated circuit wafer of claim 27, wherein at least one of the electrical characteristics comprises a current of a transistor, a threshold voltage, an inter-metal open/short state, a contact resistance and/or a capacitance.

33. An integrated circuit chip comprising:
an internal circuit including interconnected semiconductor devices that are configured to provide integrated circuit functionality;
a test element group circuit that is configured to allow measuring of electrical characteristics of the semiconductor devices;
a plurality of pads that are connected to the internal circuit;
a test element group pad that is connected to the test element group circuit;
a lead frame that is electrically connected to the plurality of pads but is not electrically connected to the test element group pad;
the integrated circuit chip in combination with a test probe that is configured to simultaneously contact the plurality of pads and the test element group pad and a test apparatus that is configured to simultaneously test the integrated circuit functionality via the plurality of pads and to measure the electrical characteristics of the semiconductor devices via the test element group pad.

34. An integrated circuit chip comprising:
an internal circuit including interconnected semiconductor devices that are configured to provide integrated circuit functionality;
a test element group circuit that is configured to allow measuring of electrical characteristics of the semiconductor devices;
a power supply line that is configured to be connected to an external power supply; and
a ground line that is configured to be connected to an external ground;
wherein the test element group circuit is electrically connected to the power supply line and/or the ground line internal to the integrated circuit chip; and wherein the test element group circuit comprises first and second complementary field effect transistors and first and second fuses that are serially connected between the power supply line and the ground line.

35. An integrated circuit chip according to claim 34 wherein the test element group circuit further comprises third and fourth fuses and wherein the first and second complementary field effect transistors and the first, second, third and fourth fuses are serially connected between the power supply line and the ground line.

36. A method of testing an integrated circuit chip comprising:
simultaneously probing an internal circuit of the integrated circuit chip that includes interconnected semiconductor devices that are configured to provide integrated circuit functionality and a test element group circuit that is configured to allow measuring of electrical characteristics of the semiconductor devices;
wherein the integrated circuit chip further comprises a plurality of pads that are connected to the internal circuit and a test element group pad that is connected to the test element group circuit, the simultaneously probing comprising:
simultaneously probing the plurality of pads and the test element group pad.

37. A method according to claim 36 wherein the simultaneously probing is performed via a test probe that is configured to simultaneously contact the plurality of pads and the test element group pad.

38. An integrated circuit chip comprising:
an internal circuit including interconnected semiconductor devices that are configured to provide integrated circuit functionality;
a test element group circuit that is configured to allow measuring of electrical characteristics of the semiconductor devices;
a ground line that is configured to be connected to an external ground, the test element group circuit comprising a plurality of metal lines and a plurality of metal contact holes, at least one of which is electrically connected to the ground line; and
a first fuse between the metal lines and the ground line and a second fuse that is electrically connected to at least one of the metal lines.

39. An integrated circuit wafer comprising:
at least one scribe line region in the wafer that is arranged to define a plurality of integrated circuit chips in the wafer including a first integrated circuit chip and a second integrated circuit chip;
the first integrated circuit chip comprising:
a first internal circuit including interconnected semiconductor devices that are configured to provide integrated circuit functionality;
a first test element group circuit that is configured to allow measuring of electrical characteristics of the semiconductor devices of the first internal circuit;
a first plurality of pads that are connected to the first internal circuit; and
a first test element group pad that is connected to the first test element group circuit;
the second integrated circuit chip comprising:
a second internal circuit including interconnected semiconductor devices that are configured to provide integrated circuit functionality;
a second test element group circuit that is configured to allow measuring of electrical characteristics of the semiconductor devices of the second internal circuit;

a second plurality of pads that are connected to the second internal circuit; and a second test element group pad that is connected to the second test element group circuit; and a lead frame that is electrically connected to the first plurality of pads but is not electrically connected to the first test element group pad.

40. An integrated circuit wafer comprising:

at least one scribe line region in the wafer that is arranged to define a plurality of integrated circuit chips in the wafer including a first integrated circuit chip and a second integrated circuit chip;

the first integrated circuit chip comprising:
 a first internal circuit including interconnected semiconductor devices that are configured to provide integrated circuit functionality;
 a first test element group circuit that is configured to allow measuring of electrical characteristics of the semiconductor devices of the first internal circuit;
 a first plurality of pads that are connected to the first internal circuit; and
 a first test element group pad that is connected to the first test element group circuit;

the second integrated circuit chip comprising:
 a second internal circuit including interconnected semiconductor devices that are configured to provide integrated circuit functionality;
 a second test element group circuit that is configured to allow measuring of electrical characteristics of the semiconductor devices of the second internal circuit;
 a second plurality of pads that are connected to the second internal circuit; and a second test element group pad that is connected to the second test element group circuit;

wherein the first test element group circuit is electrically isolated from the first plurality of pads and the second test element group circuit is electrically isolated from the second plurality of pads.

41. A method of testing an integrated circuit wafer that includes a plurality of integrated circuit chips therein, the integrated circuit chips including interconnected semiconductor devices that are configured to provide integrated circuit functionality, the method comprising:

simultaneously probing the internal circuits of at least two of the integrated circuit chips and test element group circuits of the at least two of the integrated circuit chips, a respective test element group circuit being configured to allow measuring of electrical characteristics of the semiconductor devices in the integrated circuit chip that is associated therewith.

42. A method according to claim 41 wherein a respective integrated circuit chip comprises a plurality of pads that are connected to the respective internal circuit and a test element group pad that is connected to the respective test element group circuit; the simultaneously probing comprising:

simultaneously probing the plurality of pads and the test element group pad that are associated with the at least one of the integrated circuit chips.

43. A method according to claim 42 wherein the simultaneously probing is performed via a test probe that is configured to simultaneously contact the plurality of pads and the test element group pad.

44. A method according to claim 41 further comprising:

simultaneously testing the integrated circuit functionality of the at least one of the integrated circuit chips and measuring the electrical characteristics of the semiconductor devices in the at least one of the integrated circuit chips.

45. An integrated circuit chip tester comprising:

a probe apparatus that is configured to contact a plurality of pads that are connected to an internal circuit in at least one integrated circuit chip that includes interconnected semiconductor devices that are configured to provide integrated circuit functionality and to simultaneously contact a test element group pad that is connected to a test element group circuit in the at least one integrated circuit chip that is configured to allow measuring of electrical characteristics of the semiconductor devices in the at least one integrated circuit chip.

46. An integrated circuit chip tester according to claim 45 wherein the probe apparatus is configured to simultaneously contact the plurality of pads and the test pad while the at least one integrated circuit chip is part of a wafer of integrated circuit chips.

47. An integrated circuit chip tester according to claim 45 wherein the probe apparatus is configured to simultaneously contact the plurality of pads and the test pad of a plurality of integrated circuit chips.

48. An integrated circuit chip tester according to claim 45 further comprising:

a test apparatus that is configured to simultaneously test the integrated circuit functionality via the plurality of pads and to measure the electrical characteristics of the semiconductor devices via the test element group pad.

* * * * *

UNITED STATES PATENT AND TRADEMARK OFFICE
CERTIFICATE OF CORRECTION

| | |
|---|---|
| PATENT NO. | : 7,307,441 B2 |
| APPLICATION NO. | : 10/365143 |
| DATED | : December 11, 2007 |
| INVENTOR(S) | : Sohn et al. |

Page 1 of 1

It is certified that error appears in the above-identified patent and that said Letters Patent is hereby corrected as shown below:

Column 12, Claim 26, Line 62:  Please correct "open/shod"
                                                    To read -- open/short --

Signed and Sealed this

Twenty Second Day of April, 2008

JON W. DUDAS
*Director of the United States Patent and Trademark Office*